(12) United States Patent
Kikuchi et al.

(10) Patent No.: US 9,029,861 B2
(45) Date of Patent: May 12, 2015

(54) THIN FILM TRANSISTOR AND SHIFT REGISTER

(75) Inventors: Tetsuo Kikuchi, Osaka (JP); Yoshiharu Kataoka, Osaka (JP); Shinya Tanaka, Osaka (JP); Junya Shimada, Osaka (JP); Chikao Yamasaki, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 138 days.

(21) Appl. No.: 13/809,930

(22) PCT Filed: May 20, 2011

(86) PCT No.: PCT/JP2011/002832
§ 371 (c)(1),
(2), (4) Date: Jan. 25, 2013

(87) PCT Pub. No.: WO2012/008079
PCT Pub. Date: Jan. 19, 2012

(65) Prior Publication Data
US 2014/0306225 A1    Oct. 16, 2014

(30) Foreign Application Priority Data

Jul. 16, 2010    (JP) ................................. 2010-162074

(51) Int. Cl.
*H01L 29/10*    (2006.01)
*H01L 29/76*    (2006.01)
(Continued)

(52) U.S. Cl.
CPC .......... *H01L 29/78696* (2013.01); *H01L 27/12* (2013.01); *H01L 27/1222* (2013.01); *H01L 27/0207* (2013.01)

(58) Field of Classification Search
CPC ..... H01L 29/786; H01L 27/08; H01L 27/088; H01L 21/8234; H01L 29/78696; H01L 27/1222

USPC .......... 257/66, 43, 59, 72, E27.111, E29.024, 257/E29.117, E29.12; 327/567; 345/38, 50, 345/87, 92, 100, 204–206; 349/42, 43; 438/149, 151, FOR. 183, FOR. 184, 438/FOR. 200, FOR. 201
See application file for complete search history.

(56) References Cited

U.S. PATENT DOCUMENTS

2002/0003964 A1*    1/2002    Kanbara et al. ............... 396/661
2008/0079685 A1     4/2008    Umezaki et al.
(Continued)

FOREIGN PATENT DOCUMENTS

JP    11-097701 A        4/1999
JP    11097701 A    *    4/1999
(Continued)

OTHER PUBLICATIONS

D.P. Li et al., "Synthesis and Photoluminescence of InGaO3(ZnO)m Nanowires with Perfect Superlattice Structure," Journal of Physical Chemistry C 2009, vol. 113, pp. 21512-21515.*
(Continued)

*Primary Examiner* — Meiya Li
*Assistant Examiner* — Peter M Albrecht
(74) *Attorney, Agent, or Firm* — Keating & Bennett, LLP

(57) ABSTRACT

Thin film transistors having a high current drive capability and a suitable threshold voltage are provided. The thin film transistor includes a gate electrode, an insulating layer formed on the gate electrode, a semiconductor layer formed on the insulating layer, and source/drain electrodes formed on the semiconductor layer. The semiconductor layer includes a plurality of regions separated from each other in a longitudinal direction of the source/drain electrodes.

1 Claim, 11 Drawing Sheets

(51) Int. Cl.
*H01L 31/036* (2006.01)
*H01L 31/112* (2006.01)
*H01L 29/786* (2006.01)
*H01L 27/12* (2006.01)
*H01L 27/02* (2006.01)

(56) References Cited

U.S. PATENT DOCUMENTS

2009/0180045 A1* 7/2009 Yoon et al. .................. 349/43
2010/0001259 A1* 1/2010 Saitho et al. ................. 257/24
2012/0049184 A1 3/2012 Umezaki et al.
2012/0056860 A1 3/2012 Umezaki et al.

FOREIGN PATENT DOCUMENTS

| JP | 2006-261423 | A | | 9/2006 |
| JP | 2006261423 | A | * | 9/2006 |
| JP | 2008-89915 | A | | 4/2008 |
| JP | 2010-087098 | A | | 4/2010 |
| WO | 2007/148653 | A1 | | 12/2007 |

OTHER PUBLICATIONS

Official Communication issued in International Patent Application No. PCT/JP2011/002832, mailed on Aug. 23, 2011.

* cited by examiner

THIN FILM TRANSISTOR AND SHIFT REGISTER

TECHNICAL FIELD

The present disclosure relates to thin film transistors formed of indium gallium zinc oxide (IGZO), and shift registers including such thin film transistors.

BACKGROUND ART

Thin film transistors (TFTs) are a type of field-effect transistors. TFTs have been widely used to drive pixels of a liquid crystal display (LCD) panel, for example. Parameters affecting the characteristics of a transistor include a channel length L and a channel width W.

Patent Document 1 describes changing the ratio W/L of the channel width W to the channel length L in order to change the characteristics of a transistor.

CITATION LIST

Patent Document

PATENT DOCUMENT 1: Japanese Patent Publication No. 2008-89915

SUMMARY OF THE INVENTION

Technical Problem

A gate driver and a source driver are used to drive an LCD panel. The gate driver includes shift registers corresponding to gate lines. Each shift register typically includes several transistors. A transistor in such a shift register which outputs a current to a gate line, or an output transistor, requires a high current drive capability, compared to the other transistors in the register.

Driving a higher current requires the transistor to have a larger channel width. A TFT using IGZO, or an IGZO TFT, having a larger channel width provides a lower threshold voltage. This results in a higher leakage current during the off state of the transistor. In other words, conventional IGZO TFTs were unable to provide an appropriate threshold which does not increase the leakage current while providing a high current drive capability.

Patent Document 1 assumes use of amorphous silicon (a-Si) TFTs, but fails to suggest specific techniques of using IGZO TFTs. For example, nothing in Patent Document 1 considers channel width dependence of the threshold voltage.

In view of the foregoing, it is an object of the present invention to provide thin film transistors having a high current drive capability and a suitable threshold voltage. It is another object of the present invention to provide shift registers capable of reducing the overall leakage current of transistors.

Solution to the Problem

A thin film transistor according to one embodiment of the present invention includes a gate electrode, an insulating layer formed on the gate electrode, a semiconductor layer formed on the insulating layer, and source/drain electrodes formed on the semiconductor layer. The semiconductor layer includes a plurality of regions separated from each other in a longitudinal direction of the source/drain electrodes.

The above configuration can provide thin film transistors having a high current drive capability and a suitable threshold voltage.

In one specific embodiment, channel widths corresponding to the plurality of regions are about 125 μm or less.

The above configuration can achieve a higher threshold voltage.

In one specific embodiment, channel widths corresponding to the plurality of regions are about 50 μm or less.

The above configuration can achieve a higher threshold voltage than a configuration where the channel width W is about 125 μm.

In one specific embodiment, an etch stop layer is provided between the semiconductor layer and the source/drain electrodes.

The above configuration allows the etch stop layer to protect a channel region below the source/drain electrodes from an etching process.

In one specific embodiment, the etch stop layer is provided between each of the plurality of regions.

The above configuration can protect the channel region more than when the etch stop layer is not provided between each of the plurality of regions.

In one specific embodiment, the source/drain electrodes are provided between each of the plurality of regions.

The above configuration can reduce the device area while preventing a decreased channel width. In other words, the device area can be reduced without reducing its current drive capability.

A thin film transistor according to one embodiment of the present invention includes a gate electrode, an insulating layer formed on the gate electrode, source/drain electrodes formed on the insulating layer, and a semiconductor layer formed on the source/drain electrodes. The semiconductor layer includes a plurality of regions separated from each other in a longitudinal direction of the source/drain electrodes.

The above configuration can provide thin film transistors having a high current drive capability and a suitable threshold voltage.

A shift register according to one embodiment of the present invention includes a plurality of thin film transistors. The plurality of thin film transistors include a first and a second thin film transistors. The first transistor includes a gate electrode, an insulating layer formed on the gate electrode, a semiconductor layer formed on the insulating layer, and source/drain electrodes formed on the semiconductor layer. The semiconductor layer includes a plurality of regions separated from each other in a longitudinal direction of the source/drain electrodes. The plurality of regions of the first thin film transistor have a first channel width. The second thin film transistor has a second channel width which is smallest of channel widths of the plurality of thin film transistors excluding the first thin film transistor. The first channel width is substantially the same as the second channel width.

The above configuration allows the transistors in the shift register to have substantially the same threshold. Consequently, one advantage of this approach is a reduction in the overall leakage current of the transistors in the shift register.

Advantages of the Invention

The present invention can provide thin film transistors having a high current drive capability and a suitable threshold voltage. The present invention can provide shift registers capable of reducing the overall leakage current of the transistors.

DESCRIPTION OF EMBODIMENTS

Figure 1:
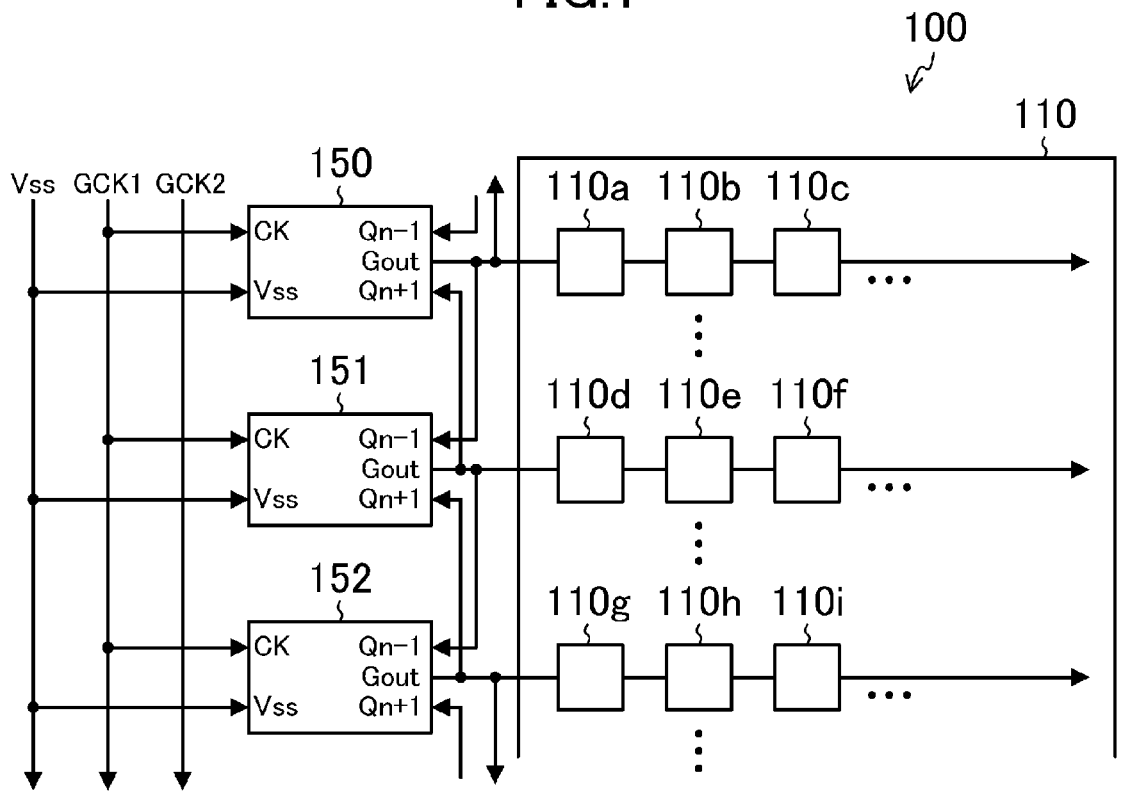
FIG. 1 is a block diagram of a gate driver in a liquid crystal display.

Thin film transistors according to example embodiments of the present invention will be described in detail with reference to the accompanying drawings. In the drawings, the same or similar components are indicated by the same reference character.

TERMS AND DEFINITIONS

The term "coupled" is intended to encompass and to be broader than the term "directly connected." If A is directly connected to B, and B is directly connected to C, then A can be said to be "coupled" to C. In other words, the term "coupled" encompass the term "indirectly connected."

As used in the specification and the claims, the term "on" used to refer to two layers, as used in "a layer B formed on a layer A," means that there is at least some contact between those layers. The term "over" means that the two layers are in proximity, but may have one or more additional layers present therebetween, where the two layers may or may not be in contact with each other. Neither "on" nor "over" implies any directions as used herein.

As used in the specification and the claims, the term "on" does not mean that a first layer "on" a second layer is directly on and in immediate contact with the second layer unless stated otherwise explicitly. In other words, there may be a third layer or other structure between the first layer and the second layer on the first layer.

The term "plan view" refers to a view of one of the two main surfaces of a substrate on which elements (e.g., a gate electrode and source/drain electrodes) are formed.

The term "layer" refers to any layer that can be formed using any suitable deposition process. The term "layer" is intended to refer to any layers used especially in the semiconductor industry including the liquid crystal display industry, such as, but not limited to, a conductive layer, an insulating layer, and an etch stop layer. The term "layer" is synonymous with the term "film" frequently used in the semiconductor industry. A layer may be formed directly on a bottom surface of a substrate, or may be formed on any of various layers or films in the substrate. A layer is typically formed of the same material using the same step, but is not intended to be limited to such formation. Alternatively, a layer may be formed of different materials using a plurality of steps.

As used in the specification and the claims, the term "channel width" refers to a distance over which two opposite source/drain electrodes (e.g., source/drain electrodes 310 and 312 in a TFT 300) overlap along a longitudinal direction (a direction SD in the drawings) of the source/drain electrodes in each region (e.g., a region 331). If a contact is provided in the source/drain electrodes (TFTs 1100 and 1500, etc.), the channel width refers to a distance over which contacts (e.g., contacts 1131c1 and 1131c2 of the TFT 1100) provided in the two opposite source/drain electrodes overlap along the longitudinal direction of the source/drain electrodes.

The term "source/drain electrodes" collectively refers to a source electrode and a drain electrode. Thus, when one of the two opposite source/drain electrodes functions as a source electrode, the other functions as a drain electrode.

Overall System

FIG. 1 is a block diagram of a gate driver in a liquid crystal display (LCD) 100. The LCD 100 includes a panel active area 110, and shift registers 150, 151, and 152. The panel active area 110 has pixels 110a-110i. Although FIG. 1 shows only nine pixels for simplicity, the panel active area 110 may include any number of pixels arranged in a matrix. The number of the shift registers 150-152 may vary depending on the number of the pixels 110a-110i.

Grounds Vss of the shift registers 150-152 are connected to a ground Vss of a power supply. Clock inputs CK of the shift registers 150 and 152 are connected to a gate clock GCK1. A clock input CK of the shift register 151 is connected to a gate clock GCK2.

An output Gout of the shift register 150 is coupled to a gate line of the pixels 110a-110c. An input Qn−1 of the shift register 150 receives an output Gout of the preceding stage (not shown). An input Qn+1 of the shift register 150 receives an output Gout of the succeeding stage (the shift register 151). In FIG. 1, the preceding stage refers to a stage located immediately above a stage of interest, while the succeeding stage refers to a stage located immediately below a stage of interest. Thus, the preceding stage of the shift register 151 is the shift register 150. The succeeding stage of the shift register 151 is the shift register 152.

An output Gout of the shift register 151 is coupled to a gate line of the pixels 110d-110f. An input Qn−1 of the shift register 151 receives an output Gout of the preceding stage (the shift register 150). An input Qn+1 of the shift register 151 receives an output Gout of the succeeding stage (the shift register 152).

An output Gout of the shift register 152 is coupled to a gate line of the pixels 110g-110i. An input Qn−1 of the shift register 152 receives an output Gout of the preceding stage (the shift register 151). An input Qn+1 of the shift register 152 receives an output Gout of the succeeding stage (not shown).

The shift registers 150-152 sequentially drive the gate lines coupled to the outputs Gout thereof. The LCD 100 is not limited to the specific configuration shown in FIG. 1 and may have any suitable configuration.

Figure 2:
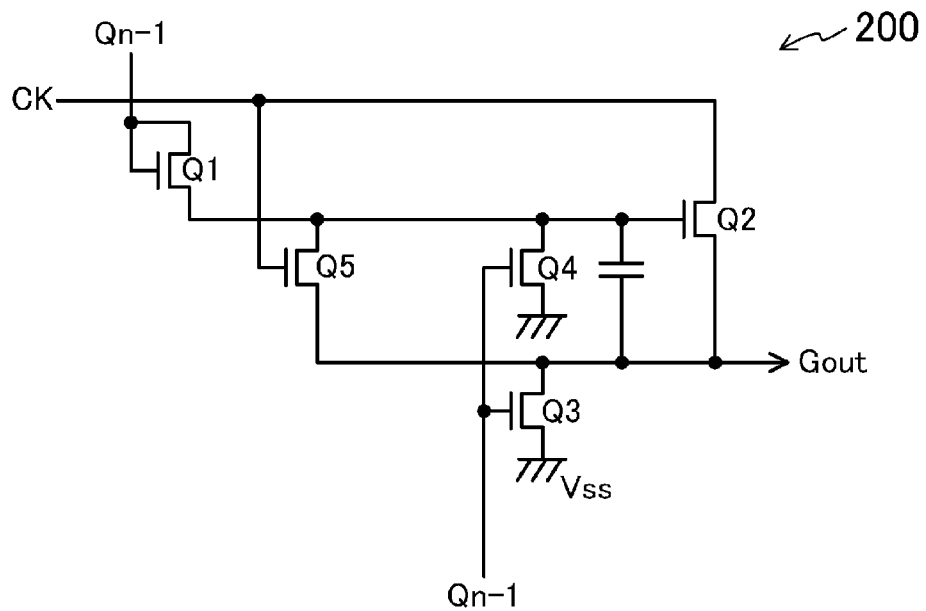
FIG. 2 is a circuit diagram of a specific example shift register.

FIG. 2 is a diagram of a specific example circuit 200 of the shift registers 150-152. The circuit 200 has transistors Q1-Q5. The shift registers 150-152 are not limited to the circuit 200, and may have any suitable circuit. The shift registers 150-152 may include any number of transistors.

Drain currents flowing through the transistors Q1-Q5 vary depending on the configurations of the shift registers 150-152. Here, in order to drive the gate line, the transistor Q2 is required to conduct the highest drain current among the transistors Q1-Q5. Conventional techniques have required a larger channel width in order to conduct a higher drain current. Thus, the transistors Q1, Q2, Q3, Q4, and Q5 according to conventional techniques result in channel widths of, e.g., about 100 μm, about 500 μm, about 200 μm, about 100 μm, and about 50 μm, respectively.

Thin film transistors (TFTs) described below may be used as the transistor Q2, for example, or alternatively, may be used as any of the other transistors (e.g., the transistors Q1, Q3, and Q4).

Structure of TFTs

Figure 3:
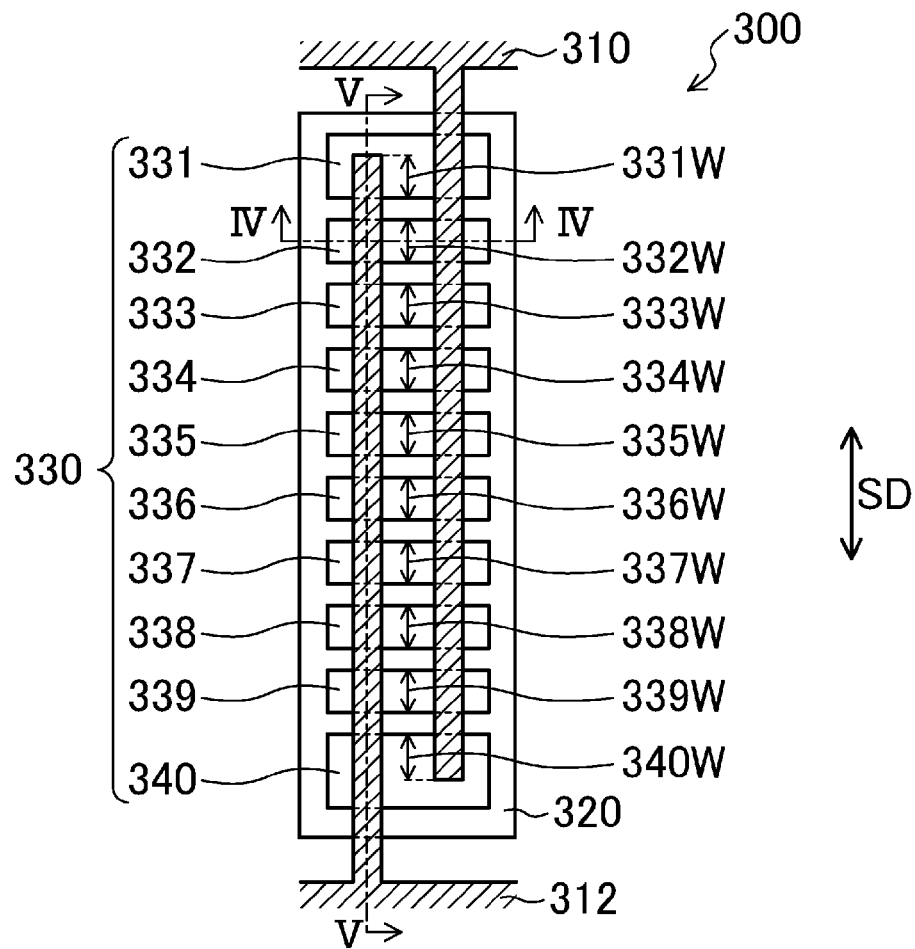
FIG. 3 is a plan view of a TFT.
Figure 4:
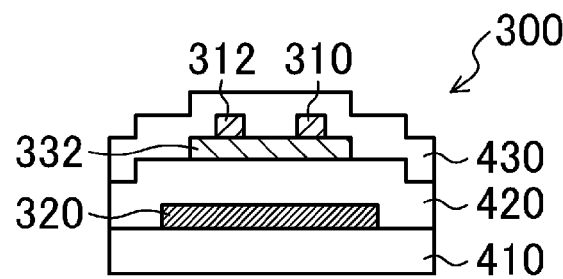
FIG. 4 is a cross-sectional view taken along line IV-IV of FIG. 3.
Figure 5:
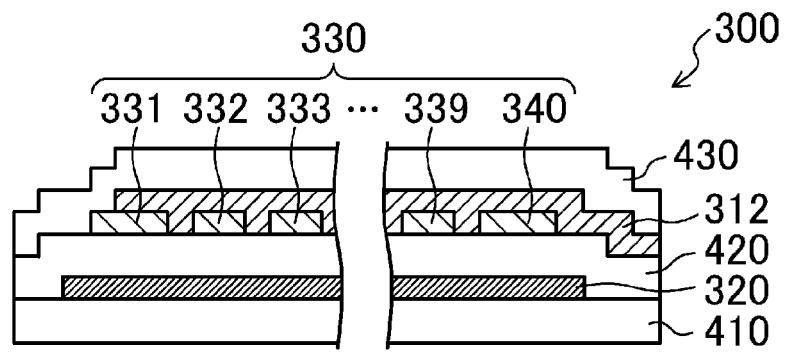
FIG. 5 is a cross-sectional view taken along line V-V of FIG. 3.
Figure 6:
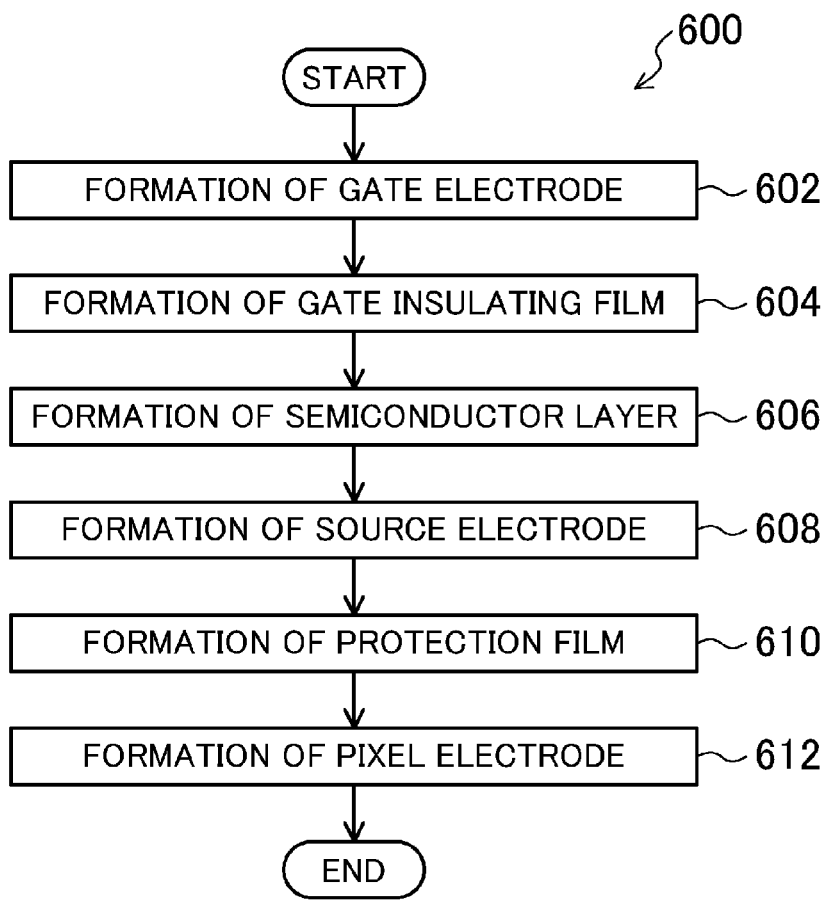
FIG. 6 is a flowchart showing a method for fabricating the TFT.

FIG. 3 is a plan view of a TFT 300. FIG. 4 is a cross-sectional view taken along line IV-IV of FIG. 3. FIG. 5 is a cross-sectional view taken along line V-V of FIG. 3. FIG. 6 is a flowchart showing a method 600 for fabricating the TFT 300. A structure of the TFT 300 and the method for fabricating the TFT 300 will be described in detail below with reference to FIGS. 3-6.

The TFT 300 has source/drain electrodes 310 and 312, a gate electrode 320, and a semiconductor layer 330. While the TFT 300 is used to implement a gate driver of an LCD, for example, the TFT 300 is not limited to such an application. Various TFTs (specifically, TFTs 300, 700, 800, 1100, 1400, 1500, and 1800) disclosed in the specification may be used in any suitable circuit.

The source/drain electrodes 310 and 312 have a multilayer structure of Ti/Al/Ti. The source/drain electrodes 310 and 312 are not limited to such a structure, and may be formed of any suitable conductive material.

The gate electrode 320 has a multilayer structure of Ti/Al/Ti. The gate electrode 320 is not limited to such a structure, and may be formed of any suitable conductive material.

The semiconductor layer 330 includes regions 331-340. The semiconductor layer 330 is formed of an amorphous oxide semiconductor (hereinafter referred to as "IGZO") containing, as major constituent elements, indium (In), gallium (Ga), zinc (Zn), and oxygen (O). Here, the TFT 300 is referred to as an IGZO TFT.

As shown in FIG. 3, the semiconductor layer 330 includes the regions 331-340 separated from each other in the longitudinal direction SD of the source/drain electrodes 310 and 312. The regions 331-340 have channel widths 331W-340W, respectively. Typically, the channel widths 331W-340W are substantially the same, e.g., about 50 μm. The TFT 300 is equivalent to transistors corresponding to the regions 331-340 which are coupled together in parallel. The transistors have substantially the same channel widths 331W-340W, and thus, have substantially the same threshold voltage.

Method for Fabricating TFTs

At 602, the gate electrode 320 is formed on a substrate 410. The substrate 410 is typically a glass substrate. The gate electrode 320 is formed by depositing materials for the gate electrode, patterning by photolithography, and then etching.

At 604, a gate insulating film 420 is formed on the gate electrode 320. The gate insulating film 420 has a multilayer structure of $SiO_2$/SiN. The gate insulating film 420 is formed by depositing materials for the gate insulating film.

At 606, the semiconductor layer 330 is formed on the gate insulating film 420. The semiconductor layer 330 is formed by depositing IGZO, patterning by photolithography, and then etching.

At 608, the source/drain electrodes 310 and 312 are formed on the semiconductor layer 330. The source/drain electrodes 310 and 312 are formed by depositing materials for the source/drain electrodes, patterning by photolithography, and then etching.

At 610, a protection film 430 is formed on the source/drain electrodes 310 and 312. The protection film 430 is formed by depositing $SiO_2$, patterning by photolithography, and then etching. At this time, the gate insulating film 420 and the protection film 430 are simultaneously etched.

At 612, pixel electrodes are formed in the pixels 110a-110i. The pixel electrodes are formed by depositing indium tin oxide (ITO), patterning by photolithography, and then etching.

Figure 7:
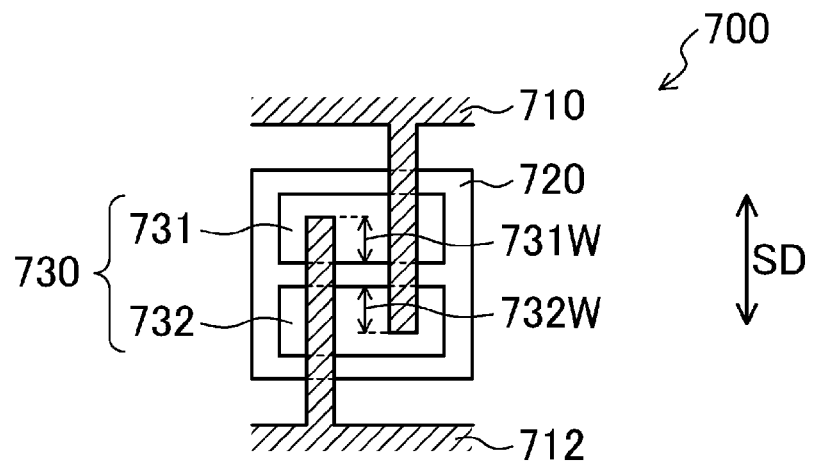
FIG. 7 is a plan view of a TFT.

FIG. 7 is a plan view of a TFT 700. The TFT 700 is similar to the TFT 300 except that a semiconductor layer 730 has two regions 731 and 732. Thus, a method for fabricating the TFT 700 is similar to the method for fabricating the TFT 300.

The TFT 700 has source/drain electrodes 710 and 712, a gate electrode 720, and the semiconductor layer 730.

The source/drain electrodes 710 and 712 have a multilayer structure of Ti/Al/Ti. The source/drain electrodes 710 and 712 are not limited to such a structure, and may be formed of any suitable conductive material.

The gate electrode 720 has a multilayer structure of Ti/Al/Ti. The gate electrode 720 is not limited to such a structure, and may be formed of any suitable conductive material.

The semiconductor layer 730 includes the regions 731 and 732. The semiconductor layer 730 is formed of IGZO. As shown in FIG. 7, the semiconductor layer 730 includes the regions 731 and 732 separated from each other in the longitudinal direction SD of the source/drain electrodes 710 and 712. The regions 731 and 732 have channel widths 731W and 732W, respectively. Typically, the channel widths 731W and 732W are substantially the same, e.g., about 50 μm. The TFT 700 is equivalent to transistors corresponding to the regions 731 and 732 which are coupled together in parallel. The transistors have substantially the same channel widths 731W and 732W, and thus, have substantially the same threshold voltage.

Figure 8:
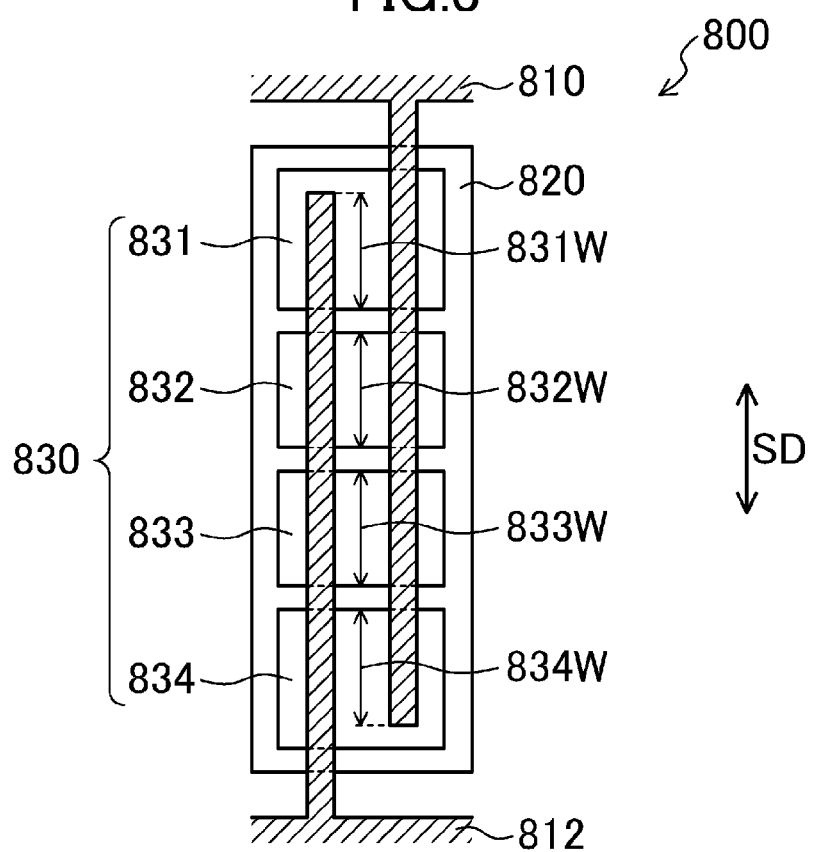
FIG. 8 is a plan view of a TFT.

FIG. 8 is a plan view of a TFT 800. The TFT 800 is similar to the TFT 300 except that a semiconductor layer 830 has four regions 831-834. Thus, a method for fabricating the TFT 800 is similar to the method for fabricating the TFT 300.

The TFT 800 has source/drain electrodes 810 and 812, a gate electrode 820, and the semiconductor layer 830.

The source/drain electrodes 810 and 812 have a multilayer structure of Ti/Al/Ti. The source/drain electrodes 810 and 812 are not limited to such a structure, and may be formed of any suitable conductive material.

The gate electrode 820 has a multilayer structure of Ti/Al/Ti. The gate electrode 820 is not limited to such a structure, and may be formed of any suitable conductive material.

The semiconductor layer 830 includes the regions 831-834. The semiconductor layer 830 is formed of IGZO. As shown in FIG. 8, the semiconductor layer 830 includes the regions 831-834 separated from each other in the longitudinal direction SD of the source/drain electrodes 810 and 812. The regions 831-834 have channel widths 831W-834W, respectively. Typically, the channel widths 831W-834W are substantially the same, e.g., about 125 µm. The TFT 800 is equivalent to transistors corresponding to the regions 831-834 which are coupled together in parallel. The transistors have substantially the same channel widths 831W-834W, and thus, have substantially the same threshold voltage.

Threshold Voltage

Figure 9:
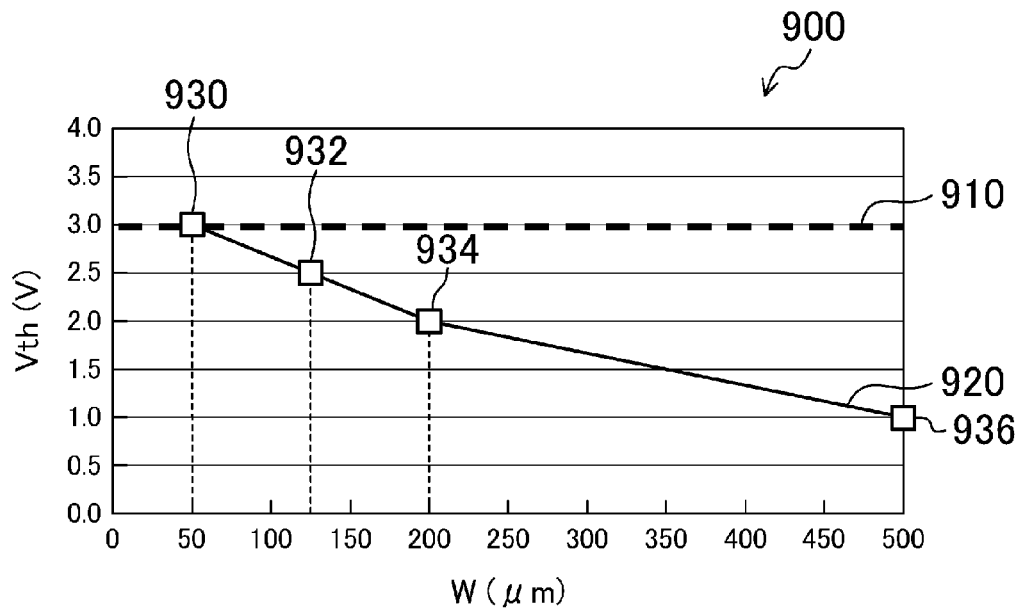
FIG. 9 is a graph showing the channel width dependence of a threshold voltage.

FIG. 9 is a graph 900 showing the channel width dependence of the threshold voltage. In the graph 900, the horizontal axis represents the channel width W [µm], and the vertical axis represents the threshold voltage [V]. A dashed line 910 represents a suitable threshold voltage Vth (e.g., about 3.0 V) of a TFT which is used in peripheral circuits (e.g., a gate driver) of an LCD. A solid line 920 represents changes in the threshold voltage Vth of an IGZO TFT as the channel width W changes. In the case of the conventional IGZO TFT, as indicated by the solid line 920, the threshold voltage Vth decreases with an increase in the channel width W. For example, the threshold voltages Vth corresponding to the channel widths W of 200 µm (point 934) and 500 µm (point 936) are 2.0 V and 1.0 V, respectively, which are not acceptable for use as LCD peripheral circuits.

In contrast to this, the TFTs 300 and 700 have a channel width of about 50 µm, and thus, the threshold voltage Vth is about 3.0 V (point 930). The TFT 800 has a channel width of about 125 µm, and thus, the threshold voltage Vth is about 2.5 V (point 932). The threshold voltages (i.e., about 2.5 V to about 3.0 V) achieved by the TFTs 300, 700, and 800 of the embodiment of the present invention are acceptable for use in LCD peripheral circuits. Thus, in various embodiments of the present invention, the channel width W is preferably about 125 µm or less, more preferably about 50 µm or less.

Thus, the embodiments of the present invention can provide thin film transistors having a high current drive capability and a suitable threshold voltage, as compared to conventional IGZO TFTs.

Leakage Current

Figure 10:
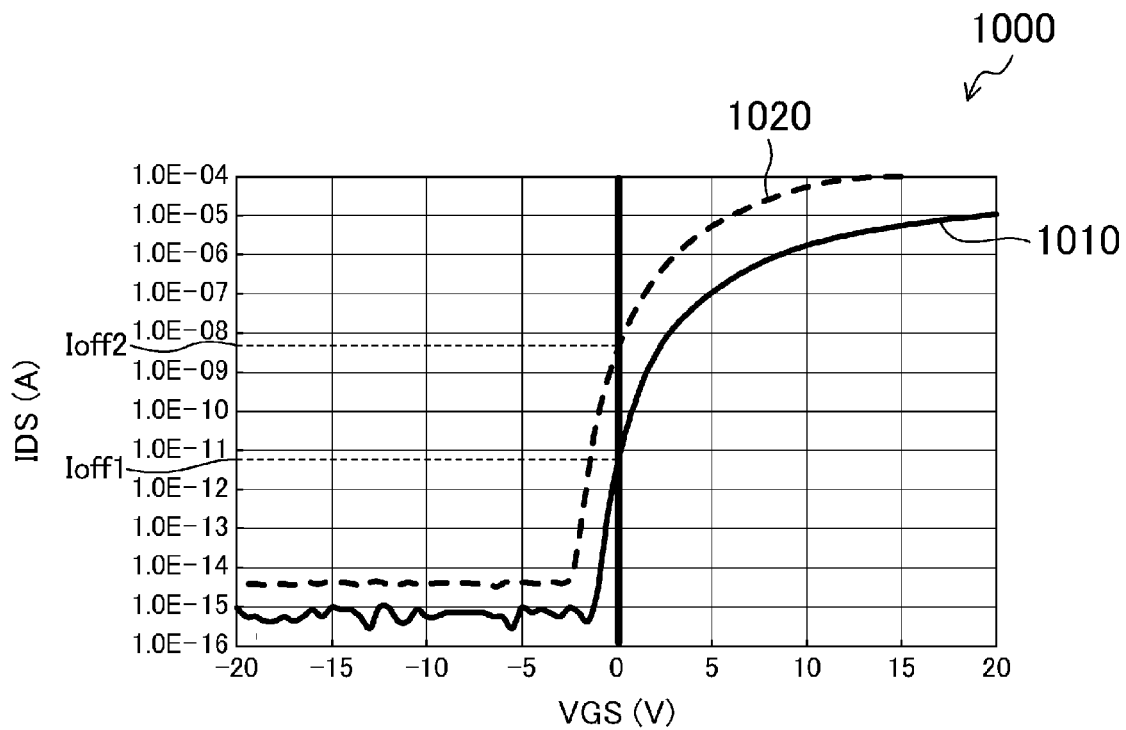
FIG. 10 is a graph showing the gate voltage dependence of a drain current.

FIG. 10 is a graph 1000 showing the gate voltage dependence of the drain current. In the graph 1000, the horizontal axis represents the gate voltage VGS [V], and the vertical axis represents the drain current IDS [A]. A solid line 1010 represents the gate voltage dependence of the drain current in the TFT 300. A dashed line 1020 represents the gate voltage dependence of the drain current in a conventional IGZO TFT. A current flowing through a transistor when turned off is referred to as a leakage current, which may cause unstable operation of the circuit. As shown in FIG. 10, a drain current Ioff1 of the TFT 300 which flows when the gate voltage VGS is zero is much lower than a drain current Ioff2 of the conventional TFT which flows when the gate voltage VGS is zero. Thus, the TFT 300 can contribute to stable operation of a circuit.

Etch Stop Layer

Figure 11:
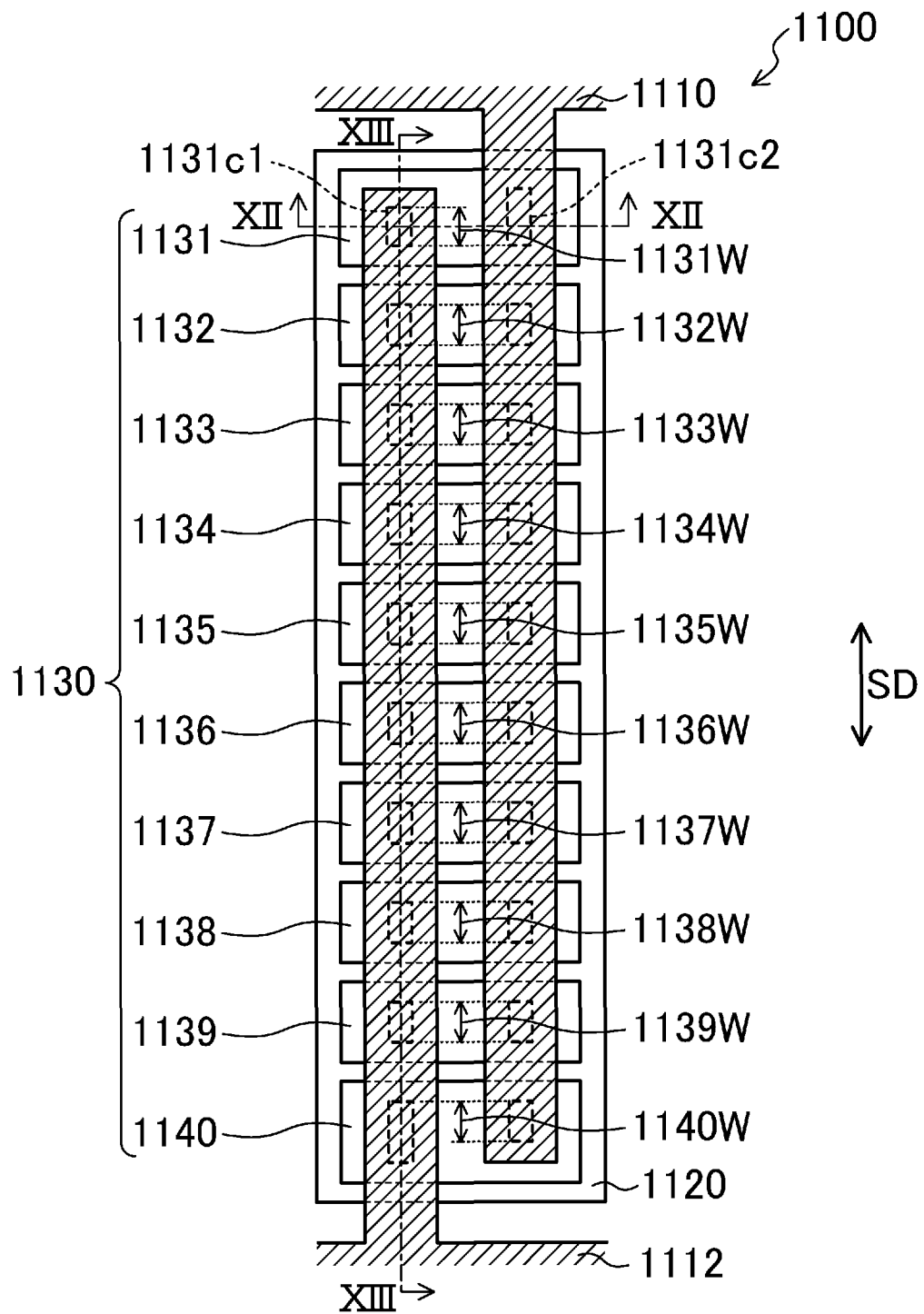
FIG. 11 is a plan view of a TFT.
Figure 12:
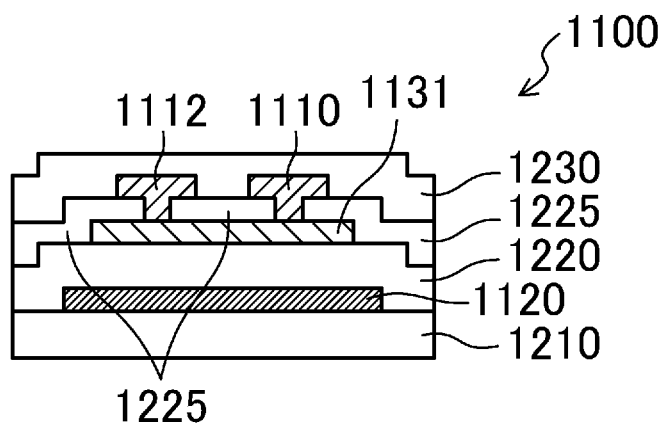
FIG. 12 is a cross-sectional view taken along line XII-XII of FIG. 11.
Figure 13:
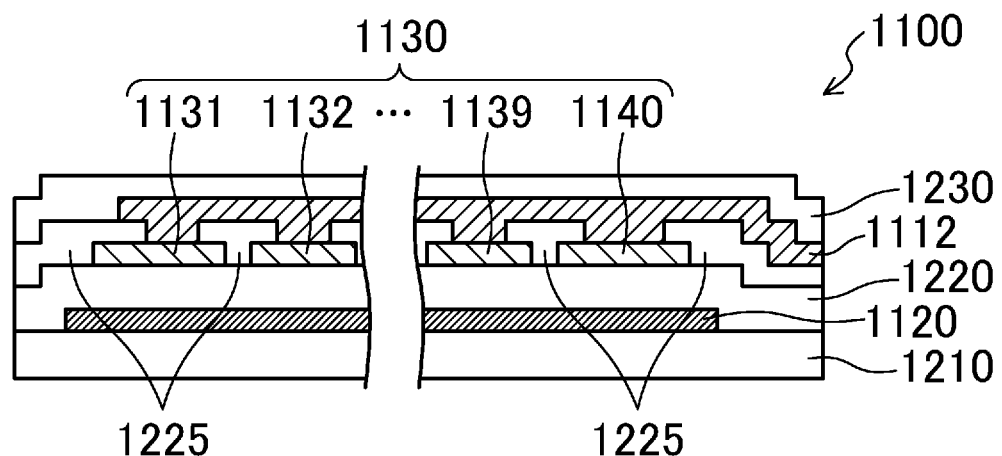
FIG. 13 is a cross-sectional view taken along line XIII-XIII of FIG. 11.

FIG. 11 is a plan view of a TFT 1100. FIG. 12 is a cross-sectional view taken along line XII-XII of FIG. 11. FIG. 13 is a cross-sectional view taken along line XIII-XIII of FIG. 11. The TFT 1100 is similar to the TFT 300 except that source/drain electrodes 1110 and 1112 have contacts 1131c and 1131c2, respectively, etc., and an etch stop layer 1225 is formed on a semiconductor layer 1130. A structure of the TFT 1100 and a method for fabricating the TFT 1100 will be described in detail below with reference to FIGS. 6 and 11-13.

The TFT 1100 has source/drain electrodes 1110 and 1112, a gate electrode 1120, and the semiconductor layer 1130. Although the TFT 1100 is used, e.g., in a gate driver of an LCD, the embodiments are not limited to such an application.

The source/drain electrodes 1110 and 1112 have a multilayer structure of Ti/Al/Ti. The source/drain electrodes 1110 and 1112 are not limited to such a structure, and may be formed of any suitable conductive material.

The gate electrode 1120 has a multilayer structure of Ti/Al/Ti. The gate electrode 1120 is not limited to such a structure, and may be formed of any suitable conductive material.

The semiconductor layer 1130 includes regions 1131-1140. The semiconductor layer 1130 is formed of IGZO. Here, the TFT 1100 is also referred to as an IGZO TFT.

As shown in FIG. 11, the semiconductor layer 1130 includes the regions 1131-1140 separated from each other in the longitudinal direction SD of the source/drain electrodes 1110 and 1112. The regions 1131-1140 have channel widths 1131W-1140W, respectively. Typically, the channel widths 1131W-1140W are substantially the same, e.g., about 50 µm. The TFT 1100 is equivalent to transistors corresponding to the regions 1131-1140 which are coupled together in parallel. The transistors have substantially the same channel widths 1131W-1140W, and thus, have substantially the same threshold voltage.

Contacts similar to the contacts 1131c and 1131c2 are also provided in the regions 1132-1140.

Referring back to FIG. 6, the method for fabricating the TFT 1100 will be described below.

At 602, the gate electrode 1120 is formed on a substrate 1210. The substrate 1210 is typically a glass substrate. The gate electrode 1120 is formed by depositing materials for the gate electrode, patterning by photolithography, and then etching.

At 604, a gate insulating film 1220 is formed on the gate electrode 1120. The gate insulating film 1220 has a multilayer structure of $SiO_2$/SiN. The gate insulating film 1220 is formed by depositing materials for the gate insulating film.

At 606, the semiconductor layer 1130 is formed on the gate insulating film 1220. The semiconductor layer 1130 is formed by depositing IGZO, patterning by photolithography, and then etching.

After 606 and before 608, the etch stop layer 1225 is formed. The etch stop layer 1225 is formed by depositing, for example, silicon oxide, patterning by photolithography, and then etching.

At 608, the source/drain electrodes 1110 and 1112 are formed on the semiconductor layer 1130. The source/drain electrodes 1110 and 1112 are formed by depositing materials for the source/drain electrodes, patterning by photolithography, and then etching.

At 610, a protection film 1230 is formed on the source/drain electrodes 1110 and 1112. The protection film 1230 is formed by depositing $SiO_2$, patterning by photolithography, and then etching. At this time, the gate insulating film 1220 and the protection film 1230 are simultaneously etched.

At 612, pixel electrodes are formed in the pixels 110a-110i. The pixel electrodes are formed by depositing ITO, patterning by photolithography, and then etching.

As shown in FIG. 13, the etch stop layer 1225 is provided between the semiconductor layer 1130 and the source/drain electrodes 1110 and 1112. The etch stop layer 1225 is provided between each of the regions 1131-1140 of the semiconductor layer 1130.

As shown in FIG. 11, the etch stop layer 1225 has 20 contact holes. The contact holes are arranged along a straight line parallel to the longitudinal direction of the source/drain electrodes 1110 and 1112. The contacts (e.g., 1131c and 1131c2) of the source/drain electrodes 1110 and 1112 are in contact with the semiconductor layers 1131-1140 via the contact holes. In addition to the advantages of the TFT 300, the TFT 1100 has the advantage that the channel region below the source/drain electrodes can be protected from the etching process by the etch stop layer 1225.

As shown in FIG. 13, the etch stop layer 1225 is provided between each of the regions 1131-1140. With this configuration, the channel region can be further protected than when the etch stop layer 1225 is not provided between each of the regions 1131-1140.

Linked Contact Holes

Figure 14:
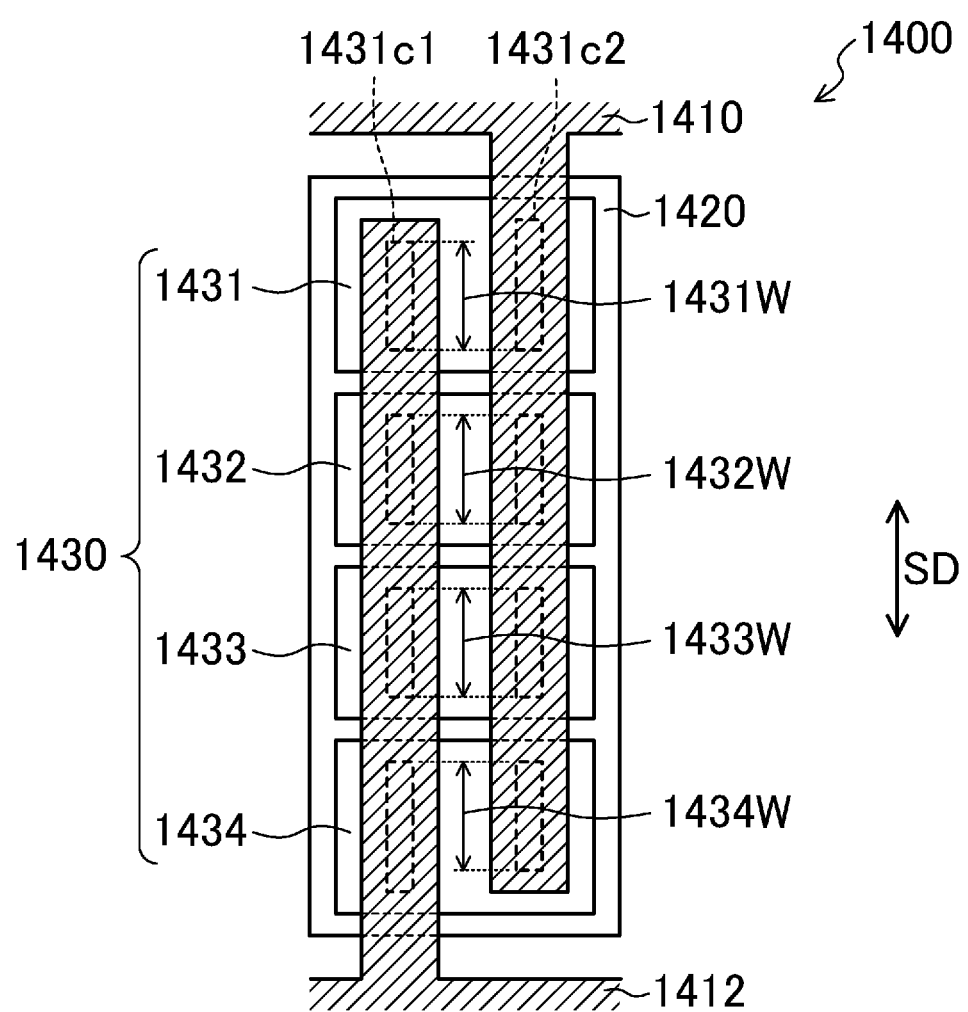
FIG. 14 is a plan view of a TFT.

FIG. 14 is a plan view of a TFT 1400. The TFT 1400 is similar to the TFT 1100 except that a semiconductor layer 1430 has four regions 1431-1434. Thus, a method for fabricating the TFT 1400 is similar to the method for fabricating the TFT 1100.

The TFT 1400 has source/drain electrodes 1410 and 1412, a gate electrode 1420, and a semiconductor layer 1430.

The source/drain electrodes 1410 and 1412 have a multilayer structure of Ti/Al/Ti. The source/drain electrodes 1410 and 1412 are not limited to such a structure, and may be formed of any suitable conductive material.

The gate electrode 1420 has a multilayer structure of Ti/Al/Ti. The gate electrode 1420 is not limited to such a structure, and may be formed of any suitable conductive material.

The semiconductor layer 1430 includes the regions 1431-1434. The semiconductor layer 1430 is formed of IGZO. As shown in FIG. 14, the semiconductor layer 1430 includes the regions 1431-1434 separated from each other in the longitudinal direction SD of the source/drain electrodes 1410 and 1412. The regions 1431-1434 have channel widths 1431W-1434W, respectively. Typically, the channel widths 1431W-1434W are substantially the same, e.g., about 125 μm. The TFT 1400 is equivalent to transistors corresponding to the regions 1431-1434 which are coupled together in parallel. The transistors have substantially the same channel widths 1431W-1434W, and thus, have substantially the same threshold voltage.

Figure 15:
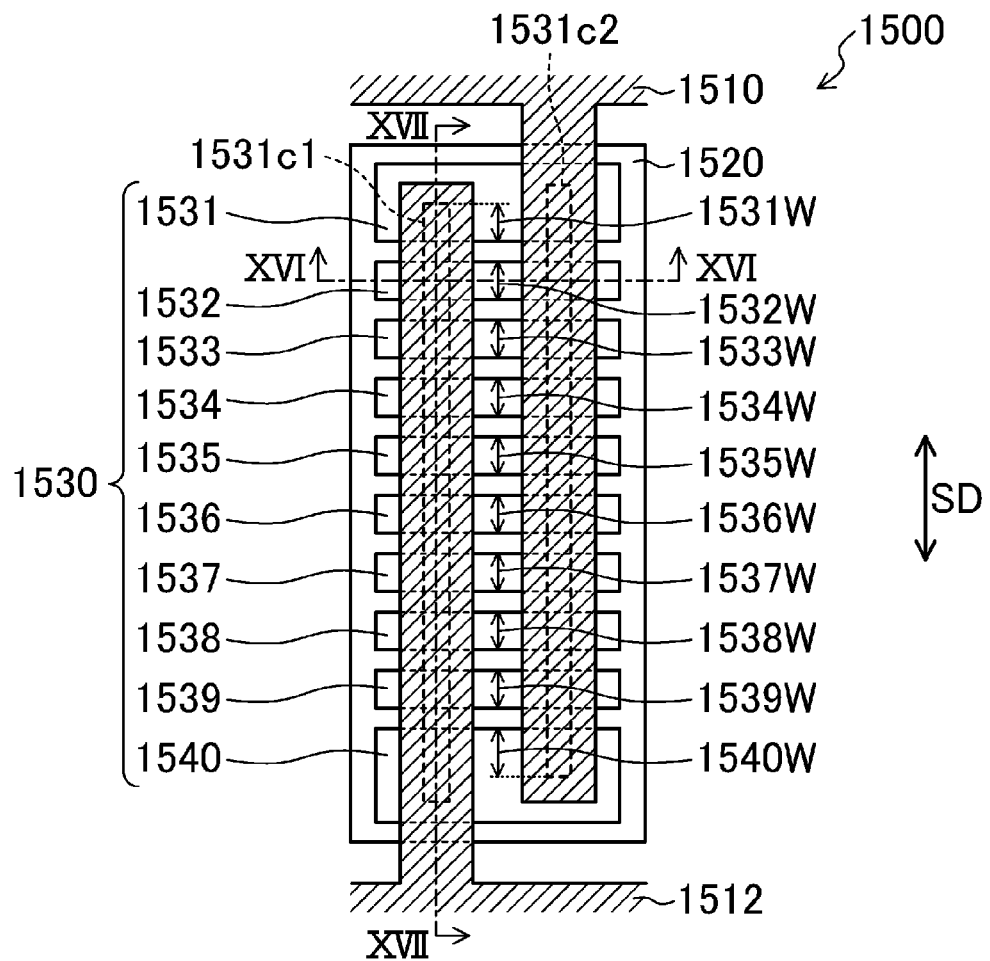
FIG. 15 is a plan view of a TFT.
Figure 16:
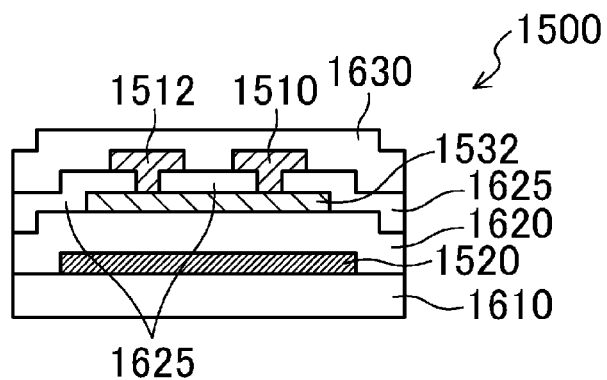
FIG. 16 is a cross-sectional view taken along line XVI-XVI of FIG. 15.
Figure 17:
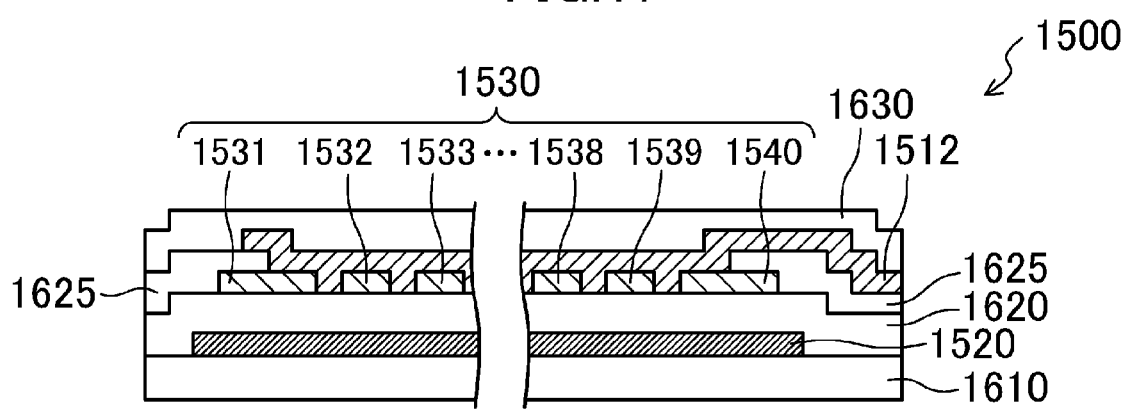
FIG. 17 is a cross-sectional view taken along line XVII-XVII of FIG. 15.

FIG. 15 is a plan view of a TFT 1500. FIG. 16 is a cross-sectional view taken along line XVI-XVI of FIG. 15. FIG. 17 is a cross-sectional view taken along line XVII-XVII of FIG. 15. The TFT 1500 is similar to the TFT 300 except that source/drain electrodes 1110 and 1112 have contacts 1531c1 and 1531c2, respectively, etc., and an etch stop layer 1625 is formed on a semiconductor layer 1530. A structure of the TFT 1500 and a method for fabricating the TFT 1500 will be described in detail below with reference to FIGS. 6 and 15-17.

The TFT 1500 has source/drain electrodes 1510 and 1512, a gate electrode 1520, and the semiconductor layer 1530. Although the TFT 1500 is used, e.g., in a gate driver of an LCD, the embodiments are not limited to such an application.

The source/drain electrodes 1510 and 1512 have a multilayer structure of Ti/Al/Ti. The source/drain electrodes 1510 and 1512 are not limited to such a structure, and may be formed of any suitable conductive material.

The gate electrode 1520 has a multilayer structure of Ti/Al/Ti. The gate electrode 1520 is not limited to such a structure, and may be formed of any suitable conductive material.

The semiconductor layer 1530 includes regions 1531-1540. The semiconductor layer 1530 is formed of IGZO. The TFT 1500 is also referred to as an IGZO TFT.

As shown in FIG. 15, the semiconductor layer 1530 includes the regions 1531-1540 separated from each other in the longitudinal direction SD of the source/drain electrodes 1510 and 1512. The regions 1531-1540 have channel widths 1531W-1540W, respectively. Typically, the channel widths 1531W-1540W are substantially the same, e.g., about 50 μm. The TFT 1500 is equivalent to transistors corresponding to the regions 1531-1540 which are coupled together in parallel. The transistors have substantially the same channel widths 1531W-1540W, and thus, have substantially the same threshold voltage.

Contacts similar to the contacts 1531c1 and 1531c2 are also provided in the regions 1532-1540.

Referring back to FIG. 6, the method for fabricating the TFT 1500 will be described below.

At 602, the gate electrode 1520 is formed on a substrate 1610. The substrate 1610 is typically a glass substrate. The gate electrode 1520 is formed by depositing materials for the gate electrode, patterning by photolithography, and then etching.

At 604, a gate insulating film 1620 is formed on the gate electrode 1520. The gate insulating film 1620 has a multilayer structure of $SiO_2$/SiN. The gate insulating film 1620 is formed by depositing materials for the gate insulating film.

At 606, the semiconductor layer 1530 is formed on the gate insulating film 1620. The semiconductor layer 1530 is formed by depositing IGZO, patterning by photolithography, and then etching.

After 606 and before 608, the etch stop layer 1625 is formed. The etch stop layer 1625 is formed by depositing, for example, silicon oxide, patterning by photolithography, and then etching.

At 608, the source/drain electrodes 1510 and 1512 are formed on the semiconductor layer 1530. The source/drain electrodes 1510 and 1512 are formed by depositing materials for the source/drain electrodes, patterning by photolithography, and then etching.

At 610, a protection film 1630 is formed on the source/drain electrodes 1510 and 1512. The protection film 1630 is formed by depositing $SiO_2$, patterning by photolithography, and then etching. At this time, the gate insulating film 1620 and the protection film 1630 are simultaneously etched.

At 612, pixel electrodes are formed in the pixels 110a-110i. The pixel electrodes are formed by depositing ITO, patterning by photolithography, and then etching.

As shown in FIG. 17, the etch stop layer 1625 is formed between the semiconductor layer 1530 and the source/drain electrodes 1510 and 1512. The source/drain electrodes 1510 and 1512 are formed between each of the regions 1531-1540 of the semiconductor layer 1530.

As shown in FIG. 15, the etch stop layer 1625 has two elongated contact holes. The contact holes are arranged in parallel to the longitudinal direction of the source/drain electrodes 1510 and 1512. The contacts (e.g., 1531c1 and 1531c2) of the source/drain electrodes 1510 and 1512 are in contact with the semiconductor layers 1531-1540 via the contact holes. In addition to the advantages of the TFT 300, the TFT 1500 has the advantage that the channel region below the source/drain electrodes can be protected from the etching process by the etch stop layer 1625.

In addition, in contrast to to the etch stop layer 1225 of the TFT 1100 which has 20 contact holes, the etch stop layer 1625 of the TFT 1500 has only two elongated contact holes. Specifically, as shown in FIG. 17, the source/drain electrodes 1510 and 1512 are provided between each of the regions 1531-1540, and the etch stop layer is not provided between each of the regions 1531-1540. In the TFT 1500, such linked contact holes can reduce the device area while preventing a decreased channel width W. In other words, the TFT 1500 also has the advantage that the device area can be reduced without reducing its current drive capability.

Modified Examples

Figure 18:
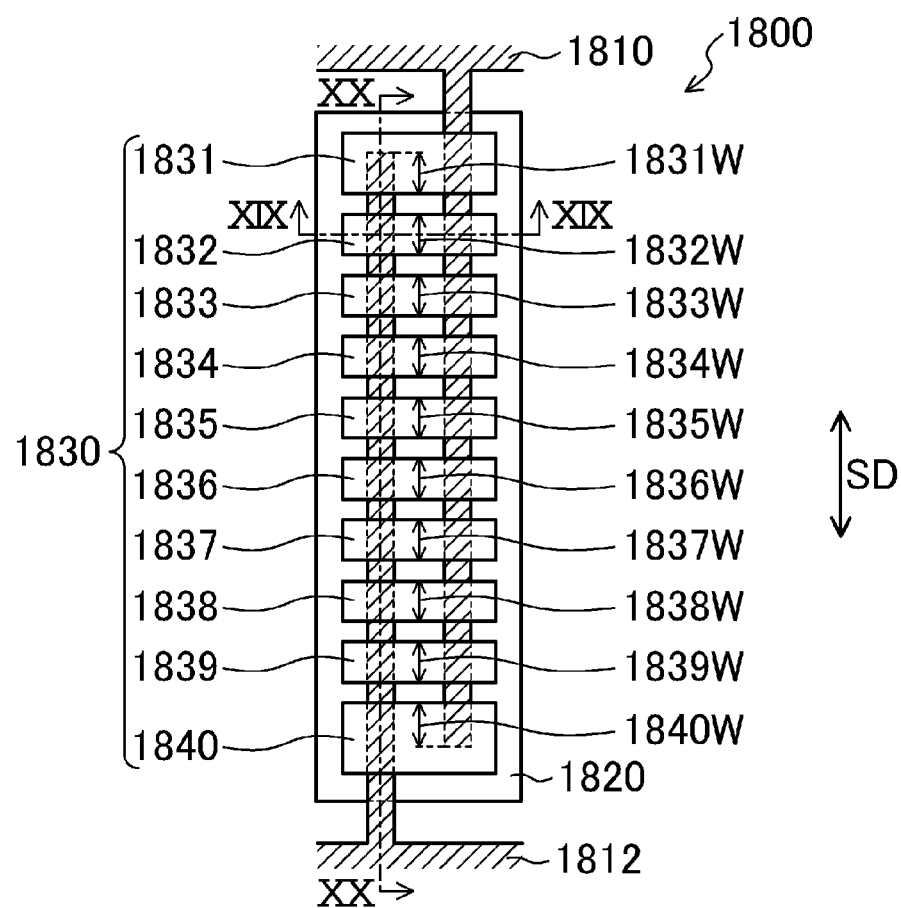
FIG. 18 is a plan view of a TFT.
Figure 19:
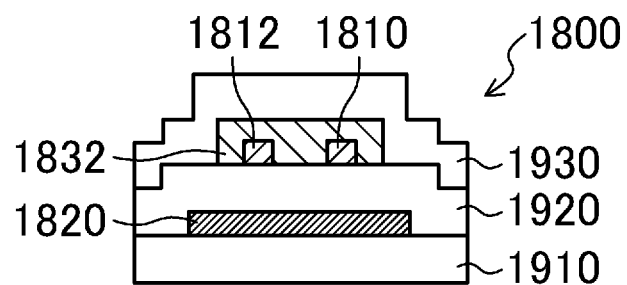
FIG. 19 is a cross-sectional view taken along line XIX-XIX of FIG. 18.
Figure 20:
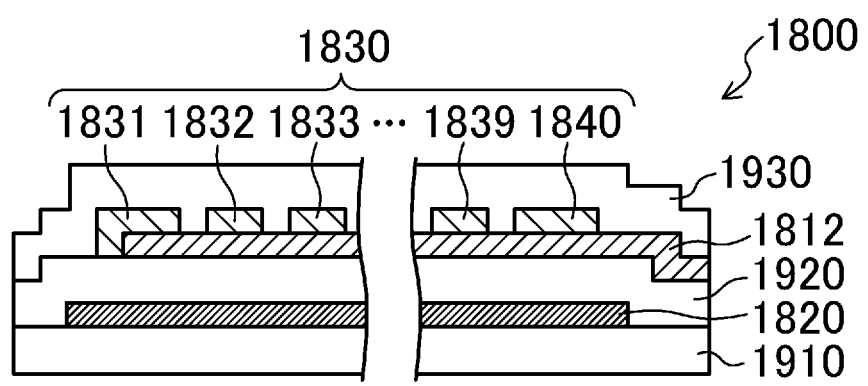
FIG. 20 is a cross-sectional view taken along line XX-XX of FIG. 18.

FIG. 18 is a plan view of a TFT 1800. FIG. 19 is a cross-sectional view taken along line XIX-XIX of FIG. 18. FIG. 20 is a cross-sectional view taken along line XX-XX of FIG. 18. A structure of the TFT 1800 and a method for fabricating the TFT 1800 will be described in detail below with reference to FIGS. 18-20 and 6.

The TFT 1800 has source/drain electrodes 1810 and 1812, a gate electrode 1820, and a semiconductor layer 1830. Although the TFT 1800 is used, e.g., to implement a gate driver of an LCD, the embodiments are not limited to such an application.

The source/drain electrodes 1810 and 1812 have a multilayer structure of Ti/Al/Ti. The source/drain electrodes 1810 and 1812 are not limited to such a structure, and may be formed of any suitable conductive material.

The gate electrode 1820 has a multilayer structure of Ti/Al/Ti. The gate electrode 1820 is not limited to such a structure, and may be formed of any suitable conductive material.

The semiconductor layer 1830 includes regions 1831-1840. The semiconductor layer 1830 is formed of an amorphous oxide semiconductor (hereinafter referred to as "IGZO") containing, as major constituent elements, indium (In), gallium (Ga), zinc (Zn), and oxygen (O). Here, the TFT 1800 is also referred to as an IGZO TFT.

As shown in FIG. 18, the semiconductor layer 1830 includes the regions 1831-1840 separated from each other in the longitudinal direction SD of the source/drain electrodes 1810 and 1812. The regions 1831-1840 have channel widths 1831W-1840W, respectively. Typically, the channel widths 1831W-1840W are substantially the same, e.g., about 50 µm. The TFT 1800 is equivalent to transistors corresponding to the regions 1831-1840 which are coupled together in parallel. The transistors have substantially the same channel widths 1831W-1840W, and thus, have substantially the same threshold voltage.

The method for fabricating the TFT 1800 is similar to the method for fabricating the TFT 300 of FIG. 6 except that the source/drain electrodes 1810 and 1812 are fabricated at 608 before the semiconductor layer 1830 is formed at 606. Specifically, a substrate 1910, a gate insulating film 1920, and a protection film 1930 correspond to the substrate 410, the gate insulating film 420, and the protection film 430, respectively, and have structures and functions similar to those of the latter ones.

The semiconductor layer 1830 of the TFT 1800 covers the source/drain electrodes 1810 and 1812. As understood by comparing FIG. 19 with FIG. 4, the TFTs 300 and 1800 have different positional relationships of the source/drain electrodes and the semiconductor layer with respect to the substrate. However, the configuration where the semiconductor layer 1830 is located close to the source/drain electrodes 1810 and 1812 allows the TFT 1800 to operate in a manner similar to that of the TFT 300, thereby having advantages similar to those of the TFT 300.

Thresholds of Transistors in Shift Register

The above TFTs (specifically, the TFTs 300, 700, 800, 1100, 1400, 1500, and 1800) including a plurality of division regions are used in, for example, a shift register (e.g., a shift register 200) included in a gate driver of an LCD. In such a case, the above TFT can be used as, for example, a transistor which needs to conduct the highest drain current in the circuit. Here, by way of example, it is assumed that the TFT 300 is used as a transistor Q2 of the shift register 200. It is also assumed that the transistors corresponding to a plurality of regions in the TFT 300 have a channel width W1 (e.g., 50 µm), and the smallest one of the channel widths of the other transistors Q1 and Q3-Q5 included in the shift register 200 is a channel width W2 (e.g., 50 µm of the transistor Q5). In this case, the channel width W1 is substantially the same as the channel width W2. If this condition for the channel widths is satisfied, the transistors Q1-Q5 in the shift register 200 have substantially the same threshold. Consequently, this approach has the advantage that the overall leakage current of the transistors in the shift register 200 can be reduced.

Various TFT structures and fabrication methods of the embodiment of the present invention have been described.

The above TFTs are of the bottom gate type (or the inverted staggered type), where the gate electrode is closer to the substrate than the source/drain electrodes are. The embodiments of the present invention, however, may be implemented as a top gate type (or staggered type) TFT.

The TFTs of the embodiment described herein may be used in applications other than LCDs. In such cases, the material for the substrate is not limited to glass and may be any suitable material.

All figures, particularly the cross-sectional views, are diagrammatic and not to scale.

What has been described above includes examples of the subject matter defined in the claims. It is, of course, not possible to describe every conceivable combination of components or methodologies for purposes of describing the subject matter defined in the claims, but one of ordinary skill in the art may recognize that many further combinations and permutations of the subject matter defined in the claims. Accordingly, the subject matter defined in the claims is intended to encompass all such alterations, modifications and variations that fall within the spirit and scope of the claims. Furthermore, the terms "have" and "include" are intended to be inclusive in a manner similar to the term "comprise" as "comprise" is interpreted when employed as a transitional word in a claim.

INDUSTRIAL APPLICABILITY

The embodiments are useful in providing thin film transistors having a high current drive capability and a suitable threshold voltage. The embodiments are also useful in providing shift registers which can reduce the overall leakage current of the transistors.

DESCRIPTION OF REFERENCE CHARACTERS

300 TFT
310, 312 Source/Drain Electrodes
320 Gate Electrode
330 Semiconductor Layer
331-340 Regions
331W-340W Channel Widths
SD Longitudinal Direction of Source/Drain Electrode

The invention claimed is:
1. A shift register comprising:
a plurality of thin film transistors, wherein
the plurality of thin film transistors of the shift register include a first thin film transistor configured to drive a gate line of a liquid crystal display, a second thin film transistor, and at least one additional thin film transistor,
the first thin film transistor includes:
a first gate electrode,
a first insulating layer formed on the first gate electrode,
a first semiconductor layer formed on the first insulating layer, and
a first plurality of source/drain electrodes formed on the first semiconductor layer, wherein
the first semiconductor layer includes a first plurality of regions separated from each other in a first direction perpendicular to a first current flow in the first semi- conductor layer between corresponding ones of the first plurality of source/drain electrodes, and each of the first plurality of regions of the first thin film transistor has a first channel width, the second thin film transistor includes:
  a second gate electrode,
  a second insulating layer formed on the second gate electrode,
  a second semiconductor layer formed on the second insulating layer, and
  a second plurality of source/drain electrodes formed on the second semiconductor layer, wherein
  the second semiconductor layer includes a second plurality of regions separated from each other in a second direction perpendicular to a second current flow in the second semiconductor layer between corresponding ones of the second plurality of source/drain electrodes, and
  each of the second plurality of regions of the second thin film transistor has a second channel width which is a smallest width of respective channel widths of the plurality of thin film transistors of the shift register excluding the first thin film transistor, and
  the first channel width is substantially the same as the second channel width.

* * * * *